United States Patent
Bolzt et al.

[11] Patent Number: 4,480,384
[45] Date of Patent: Nov. 6, 1984

[54] METHOD OF ATTACHING A RESONATOR CASING TO A PRINTED CIRCUIT

[75] Inventors: Jean Bolzt, Neuchâtel; Jean-Pierre Calame, La-Chaux-de-Fonds, both of Switzerland

[73] Assignee: Fabriques d'Horlogerie de Fontainemelon S.A., Fontainemelon, Switzerland

[21] Appl. No.: 351,098

[22] Filed: Feb. 23, 1982

[30] Foreign Application Priority Data
Feb. 23, 1981 [CH] Switzerland ............... 1183/81

[51] Int. Cl.³ .................. H05K 3/30; H05K 3/34
[52] U.S. Cl. ............................ 29/840; 29/832; 29/177
[58] Field of Search .......... 29/832, 177, 834, 836, 29/840, 852; 174/68.5; 361/400

[56] References Cited

U.S. PATENT DOCUMENTS

| | | | |
|---|---|---|---|
| 3,480,836 | 11/1969 | Aronstein | 29/840 X |
| 3,697,789 | 10/1972 | Kato et al. | 310/9.5 |
| 4,164,843 | 8/1979 | Fujimori | 58/23 R |
| 4,219,756 | 8/1980 | Nishida et al. | 310/348 |
| 4,241,436 | 12/1980 | Bolzt et al. | 29/177 X |
| 4,254,448 | 3/1981 | Martyniak | 29/832 X |
| 4,276,630 | 6/1981 | Paratte | 29/177 X |

FOREIGN PATENT DOCUMENTS

| | | | |
|---|---|---|---|
| 1094827 | 12/1960 | Fed. Rep. of Germany | 174/68.5 |
| 704365 | 2/1954 | United Kingdom | 361/400 |

Primary Examiner—Howard N. Goldberg
Assistant Examiner—Carl J. Arbes
Attorney, Agent, or Firm—Pollock, Vande Sande & Priddy

[57] ABSTRACT

An elongate opening is formed in the substrate of the printed circuit, from which project lugs formed in the copper layer on the substrate. The lugs are shaped to form a supporting cradle for the resonator which is soldered or stuck to the lugs with its base in contact with the end of the opening. Two conductive tracks extend across the opening to two resonator terminals, in the form of pins, to which they are soldered.

9 Claims, 2 Drawing Figures

METHOD OF ATTACHING A RESONATOR CASING TO A PRINTED CIRCUIT

BACKGROUND OF THE INVENTION

The present invention relates to a method of fixing the casing of a resonator to the printed circuit of a timepiece to which a resonator is fixed.

The fixing of a resonator or crystal provided with a casing, which is a relatively heavy element, to a printed circuit presents difficulties. Most often the resonator is fixed to the printed circuit by the electrical connection means themselves. As a result, these electrical connections are subjected to mechanical stresses. And, a special element is needed to keep the resonator in position during the fixing thereof on the printed circuit. This printed circuit comprises an insulating substrate and a metallic layer which defines a plurality of conductive tracks for connecting the resonator to an integrated circuit and for connecting this integrated circuit to other components of the timepiece, such as the battery and the winding of the motor.

SUMMARY OF THE INVENTION

The object of the invention is to provide a particularly simple, but nevertheless perfectly reliable, solution to the problems just described, which avoids the need for external positioning means during the assembly operation.

According to the present invention, there is provided a method of fixing a resonator casing having a longitudinal axis to a printed circuit of a timepiece, the printed circuit comprising an insulating substrate and a conductive layer forming a plurality of conductive tracks. The method comprises the steps of forming in the insulating substrate an opening having a shape that enables the casing to be inserted at least partly therein, defining in the conductive layer at least one fixing lug extending over the opening, engaging the casing in the opening with its longitudinal axis substantially parallel to the plane of the opening, so as to bring the casing into contact with the fixing lug or lugs, and mechanically joining the lug or lugs to the portion of the casing in contact therewith.

Thus, the printed circuit itself comprises the elements for positioning the resonator during fixing to the printed circuit; that is, a supporting cradle formed by the lug or lugs, these elements thereafter serving for the mechanical fixing of the casing of the resonator.

Preferably, the lug or lugs have a curved shape so that they match the shape of the casing of the resonator when the latter is cylindrical. This curved shape is obtained either with the aid of a special tool prior to the positioning of the resonator or by the resonator itself which then constitutes a forming tool.

The invention further provides a printed circuit provided with a resonator for a timepiece comprising an insulating substrate with an opening therein, a metallic conductive layer bonded to the substrate so as to form a plurality of conductive tracks and at least one lug of curved shape extending over the opening, a resonator having a cylindrical casing and at least two connection terminals, the casing being fixed to the curved lug or lugs which form a supporting cradle for the casing, and means electrically connecting the terminals to the tracks.

BRIEF DESCRIPTION OF THE DRAWINGS

The invention will be described in more detail, by way of example, with reference to the accompanying drawings, in which.

DETAILED DESCRIPTION OF THE PREFERRED EMBODIMENTS

Figure 1:
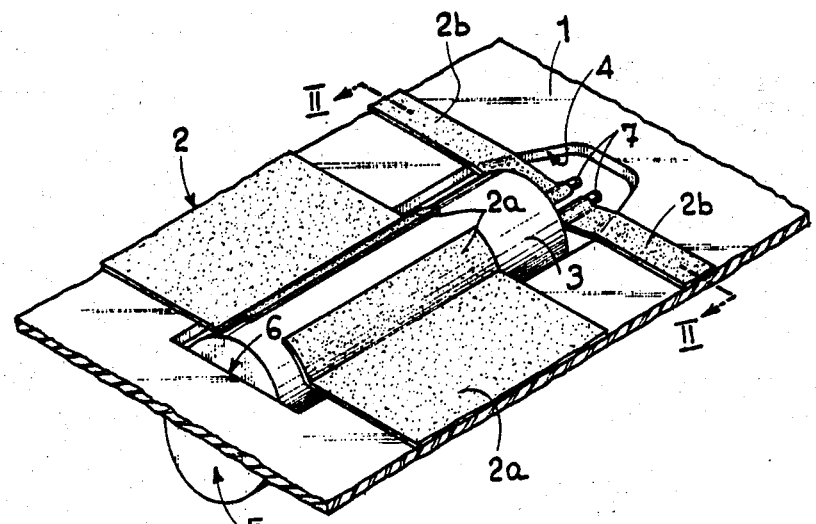
FIG. 1 is a perspective view of a part of a printed circuit for a timepiece provided with an encapsulated resonator.

The printed circuit, part of which is shown, comprises a substrate 1, made for example of KAPTON (Registered Trade Mark) which is a polyamide, to one surface of which is bonded a copper layer 2 in which the conductive tracks of the circuit are provided. These could equally well be pre-formed and then stuck on the substrate.

It is required to fix to the printed circuit the resonator of the timepiece, for example a quartz resonator, of which only the cylindrical casing 3 and its terminal pins 7 are visible in the drawing. To this end there is formed in the substrate 1 an elongate opening 4 the shape and dimensions of which correspond generally to those of the resonator and which is designed to receive the resonator. Thus the opening 4 should enable the casing of the resonator to be at least partly inserted herein. The metallic layer 2 is given in configuration such that it has two lugs 2a extending partially across the opening 4 and two tracks 2b likewise extend partially across the opening. Before the casing 3 is inserted in the opening 4, the lugs 2a are pre-formed in such a manner that they constitute a supporting cradle for the cylindrical casing 3.

Alternatively, it would be possible not to deform the lugs 2a beforehand but to allow them to become deformed by the casing 3 when it is engaged in the opening 4, which is possible because of the high degree of malleability of copper.

When the casing 3 is placed in position, it assumes a disposition such that its longitudinal axis is parallel to the plane of the substrate and hence to the longitudinal axis of the opening. Moreover, care should be taken to ensure that the base 5 of the casing is in contact with one of the ends 6 of the opening 4, so as to determine the longitudinal position of the resonator on the printed circuit. The resonator is permanently maintained in position in the opening 4 by soldering or sticking the lugs 2a to its casing 3.

Since the longitudinal position of the casing 3 is positively determined, its terminal pins 7 are positioned to contact the ends of the conductive tracks 2b, which are then soldered to the terminal pins.

Figure 2:
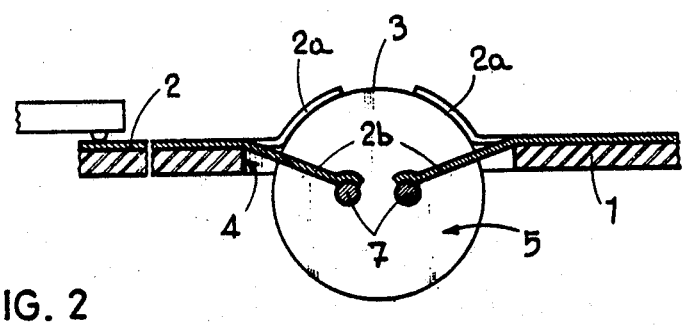
FIG. 2 is a section taken on the line II—II of FIG. 1.

Obviously, it would be possible to provide only one lug 2a over the opening 4, so long as the single lug were of sufficient length to form by itself the entire cradle support of the resonator. Moreover, the extensions 2b of the conductive tracks are bent down in FIG. 2. This is not essential. The supporting cradle (lugs 2a) could define for the casing a position such that the terminal pins 7 of the resonator will be in the plane of the conductive layer 2. In this case, the extensions 2b will be parallel to the remainder of the conductive layer. In all cases, the connections between the terminal pins 7 and the extensions 2b serve only for the electrical contact.

The resonator can thus be fixed to the substrate of a printed circuit without the need for any external jig and without any supplementary preparatory operation even being required, apart from the positioning of the resonator and the soldering or bonding thereof to the lugs 2a and the soldering of its terminals 7 to the tracks 2b, the particular shape of the substrate 1 (opening 4) as well as that of the conductive layer 2 which is supported thereby (lugs 2a) being obtained by the same operations that produce the printed circuit. It is sufficient to form the opening 4 in the substrate before sticking on the conductive tracks and to provide the fixing lugs 2a when defining the metal coatings as a whole.

It should be noted that the lugs 2a which keep the resonator 5 in position can serve in addition for connecting the resonator casing to earth.

What is claimed is:

1. A method for fixing a resonator casing having a longitudinal axis to a printed circuit of a timepiece, said printed circuit comprising an insulating substrate and a conductive layer forming a plurality of conductive tracks, the method comprising the steps of:
    forming in said insulating substrate an opening having a shape that enables said casing to be inserted at least partly therein;
    forming in said conductive layer at least one fixing lug means integral with said layer, said fixing lug means extending over said opening and over at least a portion of such a casing; inserting said casing in said opening; shaping said at least one fixing lug means to form a cradle for said casing by engaging said casing in said opening with said longitudinal axis substantially parallel to the plane of said opening and bringing said casing into contact with said at least one fixing lug means to deform said at least one fixing lug means into said cradle; and
    mechanically joining said at least one fixing lug means to the portion of said casing in contact with said cradle.

2. A method according to claim 1, wherein said casing has an end surface substantially perpendicular to said longitudinal axis, said casing being engaged in said opening, said end surface of said casing being in contact with an edge of said opening.

3. A method according to claim 1, wherein said at least one fixing lug means comprises two fixing lugs in alignment with each other.

4. A method according to claim 3, wherein said casing has a generally cylindrical shape and said two fixing lugs are curved to form said cradle for said casing.

5. A method according to claim 1, 2, 3 or 4, wherein said resonator casing is provided with two connecting terminals, said method further comprising the steps of forming two prolongations of said conductive tracks, said prolongations extending over said opening; and bonding said connecting terminals to said prolongations, after said mechanically joining of said at least one fixing lug means to said casing.

6. A method for fixing a resonator casing having a longitudinal axis to a printed circuit of a timepiece, said resonator casing having two connecting terminals said printed circuit comprising an insulating substrate and a conductive layer forming a plurality of conductive tracks, the method comprising the steps of:
    forming in said insulating substrate an opening having a shape that enables said casing to be inserted at least partly therein;
    forming in said conductive layer at least one fixing lug means integral with said layer, said fixing lug means extending over said opening and over at least a portion of such a casing;
    inserting said casing in said opening; forming two prolongations of said conductive tracks, said prolongations extending over said opening;
    engaging said casing in said opening with said longitudinal axis substantially parallel to the plane of said opening and bringing said casing into contact with said at least one fixing lug means;
    thereafter mechanically joining said at least one fixing lug means to said casing to support said casing on said printed circuit; and
    thereafter bonding said connecting terminals to said prolongations to electrically connect said resonator to said printed circuit; and 7. A method according to claim 6, wherein said casing has an end surface substantially perpendicular to said longitudinal axis, said casing being engaged in said opening, said end surface of said casing being in contact with an edge of said opening.

8. A method according to claim 6, wherein said at least one fixing lug means comprises two fixing lugs disposed in alignment with each other.

9. A method according to claim 8, wherein said casing has a generally cylindrical shape and said two fixing lugs are curved to form a cradle for said casing.

* * * * *